United States Patent
Kolluri

[11] Patent Number: 5,952,882
[45] Date of Patent: Sep. 14, 1999

[54] GAIN ENHANCEMENT FOR OPERATIONAL AMPLIFIERS

[75] Inventor: Madhav V. Kolluri, Sunnyvale, Calif.

[73] Assignee: Maxim Integrated Products, Inc., Sunnyvale, Calif.

[21] Appl. No.: 09/010,467

[22] Filed: Jan. 22, 1998

[51] Int. Cl.[6] .................................................. H03F 3/45
[52] U.S. Cl. ............................................ 330/255; 330/257
[58] Field of Search .................................... 330/255, 311, 330/253, 257, 258

[56] References Cited

U.S. PATENT DOCUMENTS 5,420,540 5/1995 Butler ........................................ 330/255

Primary Examiner—Robert Pascal
Assistant Examiner—Patricia T. Nguyen
Attorney, Agent, or Firm—Blakely, Sokoloff, Taylor & Zafman LLP

[57] ABSTRACT

Operational amplifiers with a gain enhancement apparatus and method result in a substantial improvement in the gain of such amplifiers without change in the gain of the signal amplifying transistors. The gain enhancement is achieved by providing a circuit for having one transistor in the folded cascode stage of the amplifier substantially track the operating conditions of another transistor in the folded cascode stage, thereby substantially eliminating the unbalanced differential drive from the differential input stage that would have been required to accommodate the Early effect in the second stage. This is particularly advantageous when driving MOS output drivers wherein large voltage excursions in the second stage are required, particularly when sinking current from a load.

8 Claims, 6 Drawing Sheets

# GAIN ENHANCEMENT FOR OPERATIONAL AMPLIFIERS

BACKGROUND OF THE INVENTION

1. Field of the Invention

The present invention relates to the field of operational amplifiers.

2. Prior Art

Operational amplifiers of various types are well known in the prior art. Such amplifiers may be characterized as having a differential input of a high impedance, a single-ended output of a low impedance and a high gain, as in FIG. 1. Most present day operational amplifiers are required to operate from a single power supply voltage with the common mode input voltage range extending to ground, and the output voltage capable of swinging to both supply rails. These amplifiers typically have a folded cascode stage which converts the double-ended output of the differential input stage to a single-ended drive for the complementary output drivers. Such an amplifier may be seen in the circuit of FIG. 2, which is representative of prior art amplifiers.

In the circuit of FIG. 2, current I1 from a current source is provided to a pair of source-coupled p-channel transistors P1 and P2. The current I1 will divide between transistors P1 and P2 in a proportion responsive to the differential voltage applied between the positive and negative inputs to the gates of those transistors, setting the gate to source voltages of the transistors.

The folded cascode stage of the operational amplifier illustrated in FIG. 2 is comprised of current sources I2, I3, I4 and I6, p-channel transistor P3, n-channel transistor N1, bipolar transistors Q1 and Q2, and resistors R1 and R2. Current source I2 sets a predetermined current I2 through transistor Q1 and a corresponding current component through resistor R1, and current source I3 sets a predetermined current I3 through transistor Q2 and a corresponding current component through resistor R2. Resistors R1 and R2 also receive current components totaling I1 from the differential input stage. The voltage of the common base connection of transistors Q1 and Q2 is set through a local feedback loop composed of p-channel source follower P3 and n-channel source follower N1. In particular, if transistor Q1 is not sufficiently turned on to carry the current I2, current source I2 will charge node A, driving the same high to turn off p-channel transistor P3. Now, current source I4 will charge node C, raising the voltage on the gate of n-channel transistor N1 to turn on the n-channel transistor more, thereby raising the base voltage of transistors Q1 and Q2 to turn on transistor Q1 sufficiently to carry the current I2. Similarly, if transistor Q1 is turned on too hard so as to conduct more current than I2, the voltage on node A will be lower and will turn on p-channel transistor P3 more. Thus, the voltage on the gate of n-channel transistor N1 will be lower, tending to reduce the conduction through transistor N1 to lower the base voltage on the transistors so as to reduce the conduction of transistor Q1 to just that required to carry the current I2. In a typical amplifier of the type being described, current sources I2 and I3 will be equal, transistors Q1 and Q2 will be identical and resistors R1 and R2 will be equal.

In operation, the two fractional components of the current I1 through p-channel transistors P1 and P2 will also flow through resistors R1 and R2, respectively. When the differential input voltage applied to the gates of p-channel transistors P1 and P2 is zero, the current I1 will divide equally to flow through resistors R1 and R2. Accordingly, in this state the voltage across resistor R1 will equal (I1)(R1)/2+(I2)(R1). Similarly, the voltage across resistor R2 will be equal to (I1)(R2)/2+(I3)(R2). Assuming I2 equals I3 and R1 equals R2, the voltage across resistors R1 and R2 will be equal, the voltage on the bases of transistors Q1 and Q2 will be one VBE above the voltage across resistors R1 and R2. In normal operation with no load, the voltage at node B will be at the gate-source voltage of N2. The device sizes of P3 and N1 are chosen such that the voltage at node A is substantially the same as the voltage at node B.

The quiescent current in the output n-channel transistor N2 and p-channel transistor P4 is controlled by the block labeled PMOS DRIVE. This block also controls the drive to the p-channel transistor when sourcing a load current.

In addition to providing drive current to an external load, the output stage in this amplifier also provides voltage gain and is the second gain stage of the overall amplifier. The requirement of the output being able to swing rail-to-rail of most present day amplifiers precludes the use of a buffer between the second gain stage and output of the amplifier. The overall gain of this amplifier is given by AV=A1*A2 where
  A1=gain of the combination of input stage and the folded cascode stage and equals the change in voltage at node B divided by the applied differential input voltage
  A2=gain of the second stage and equals the change in output voltage divided by the change in voltage at node B In normal operation, a change in the output voltage at VOUT will require a change in the voltage at node B of ΔVOUT/A2. Thus, the collector to emitter voltages of Q2 will change as a function of the output voltage. The voltage at node A will be substantially independent of the change in the output voltage and thus, the collector to emitter voltage of Q1 is independent of the output voltage. Finite output impedance of the transistors due to Early voltage effects will cause the currents in both transistors to be different for unequal collector to emitter voltages. Consequently, the current in resistors R1 and R2 will be unbalanced as a function of a change in the output voltage. This has to be compensated by a non-zero differential voltage to the p-channel input pair of P1 and P2. When driving a heavy output load, the gain of the second stage is lower than its no load value, thus reducing the overall gain of the amplifier even further.

For example, when a small resistor is connected between the output and the positive supply, the current in the n-channel transistor is a function of VOUT. When the output voltage swings between the positive supply and ground, a large excursion in the voltage of node B is required to support the large change in the current in n-channel transistor N2.

At the same time, the voltage of node A will be substantially constant, as the differential input will still be relatively small and the current component in resistor R1 from the non-zero differential input to the amplifier will also be small. Consequently for high voltages at node B for sinking large load currents, the collector to emitter voltage of bipolar transistor Q2 will be much larger than for bipolar transistor Q1. Because of the Early effect, the base to emitter voltage of transistor Q2 to provide a collector current in transistor Q2 equal to I3 will be less than the base emitter voltage of transistor Q1 to provide the same collector current. Consequently to obtain the higher voltages for node B, since the base voltages of transistors Q1 and Q2 are equal, the current through resistor R2 must be higher than the current through resistor R1. This higher current thorough transistor R2 must come from the input stage, requiring that transistor P2 be turned on a little more and transistor P1 be turned off a little, or the differential input voltage be a little more negative than for lighter loads. Since the output was assumed to be sinking current, the differential input must have been negative anyway. Therefore it may be seen that the increased negative differential input voltages required to drive larger loads represents a reduction in the gain of the amplifier (ratio of output to input to the amplifier). Consequently such amplifiers suffer an undesired reduction in gain for larger loads, contrary to the desired high gain for such amplifiers.

BRIEF SUMMARY OF THE INVENTION

Operational amplifiers with a gain enhancement apparatus and method result in a substantial improvement in the gain of such amplifiers without change in the gain of the signal amplifying transistors. Such amplifiers include a differential input stage and a folded cascode stage having a pair of devices which convert the differential output of the first stage to a single ended output for driving the output devices. The gain enhancement is achieved by providing a circuit for having one transistor in the folded cascode stage of the amplifier substantially track the operating conditions of the other transistor in the folded cascode stage, thereby substantially eliminating the unbalanced differential drive from the differential input stage that would have been required to accommodate the Early effect in the folded cascode stage. This is particularly advantageous when driving MOS output drivers wherein large voltage excursions in the folded cascode stage are required, particularly when sinking current from a load.

DETAILED DESCRIPTION OF THE INVENTION

Figure 1:
FIG. 1 presents the typical circuit symbol for an operational amplifier.
Figure 2:
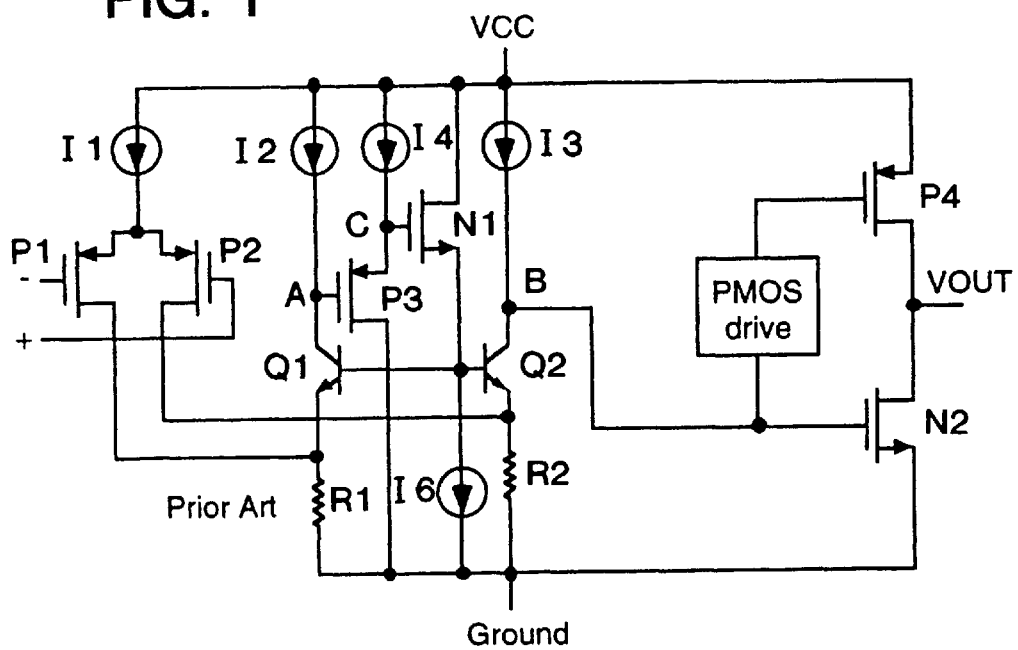
FIG. 2 is a circuit diagram representative of prior art operational amplifiers.
Figure 3:
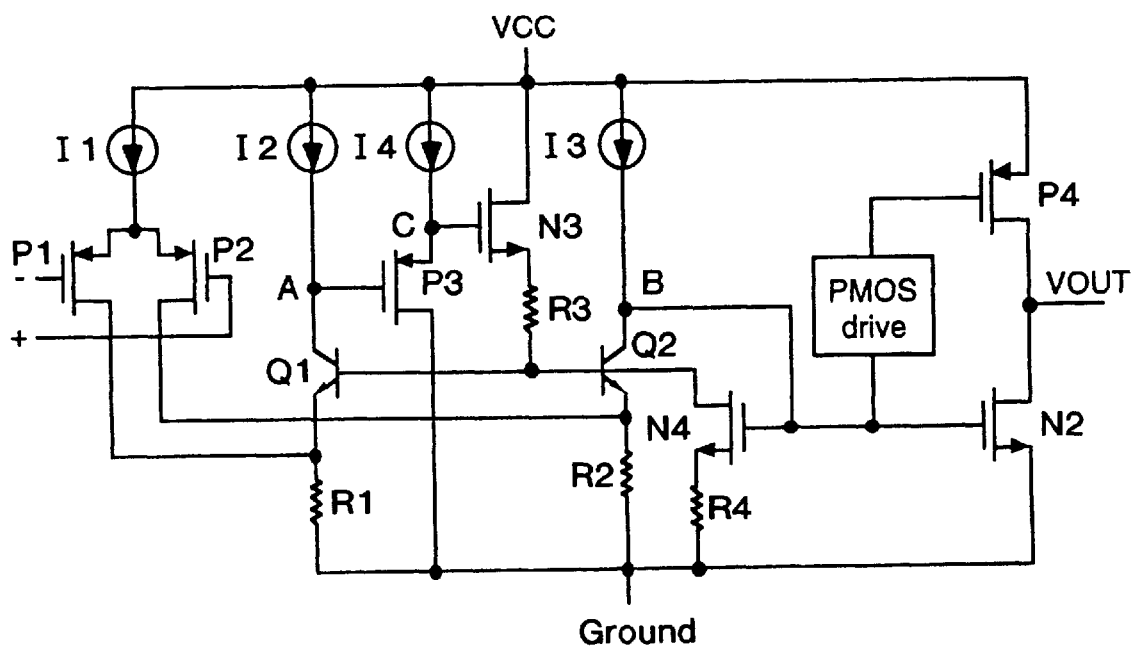
FIG. 3 is a circuit diagram for one embodiment of the present invention.

Now referring to FIG. 3, a circuit diagram for one embodiment of the present invention may be seen. In this circuit, p-channel transistors P1, P2, P3 and P4, n-channel transistor N2, bipolar transistors Q1 and Q2 and resistors R1 and R2, as well as the PMOS drive circuit shown in block form, are connected and function as described with respect to FIG. 2. However, additional circuitry has been added to cause the voltage at node A to approximately track the voltage at node B. As in the circuit of FIG. 2, the voltage on the collector of bipolar transistor Q2 (node B) is connected to the gate of output n-channel transistor N2 and through the PMOS drive to the gate of p-channel output transistor P4.

In FIG. 3, node B is also connected to the gate of n-channel transistor N4. This establishes a current through resistor R4 which is equal to the voltage of node B minus the gate-source voltage of n-channel transistor N4, all divided by the value of resistor R4. This current through n-channel transistor N4 and resistor R4 is provided by n-channel transistor N3 and resistor R3. Accordingly, if n-channel transistor N3 approximately matches n-channel transistor N4, and resistors R3 and R4 are approximately equal, the voltage at node C will be higher than the common base voltage of bipolar transistors Q1 and Q2 by an amount approximately equal to the voltage of node B. If the dimensions of p-channel transistor P3 are such that its gate-source voltage is approximately equal to the nominal voltage at the common base connection of transistors Q1 and Q2, the voltage at node A will be approximately equal to the voltage at node B over the full operating range of the amplifier. In that regard, a first order approximation to tracking of the voltages of nodes A and B is a substantial improvement over the prior art, as gain enhancements of up to 20 dB can be achieved with even approximate tracking. Thus perfection in the tracking is not required. In one embodiment, resistors R3 and R4 are equal to each other, though n-channel transistors N3 and N4 are not identical transistors. In that regard, compromises in the degree of tracking may readily be made to accommodate such considerations as the headroom for the operation of n-channel transistor N3 and the variation in the gate-source voltage of p-channel transistor P3 with temperature.

The biasing of the circuit of FIG. 3 may be explained as follows. If the voltage on the common bases of bipolar transistors Q1 and Q2 is too low, as on initial turn on of the circuit, transistors Q1 and Q2 will be off, or at least conduct less current than is provided by current sources I2 and I3 respectively. In this case, current source I2 will charge node A, driving the same high to turn off p-channel transistor P3. Now current source I4 will charge node C, driving the same high to turn on n-channel transistor N3 to provide current through resistor R3 as required to pull the common base connection of bipolar transistors Q1 and Q2 sufficiently high so that the current through transistor Q1 is equal to I2. At this point, the voltage across resistor R1 is that provided by both the current source I2 and the fraction of the current I1 passing through p-channel transistor P1 at the differential input to the amplifier. Because the voltage at node A approximately tracks the voltage at node B, the base-emitter voltages of transistors Q1 and Q2 are substantially equal. Thus the current in resistor R2 substantially equals the current in resistor R1. Also, because the current sources I2 and I3 are equal, the fraction of the current I1 passing through p-channel transistor P2 at the differential input to the amplifier must be substantially equal to the fraction of the current I1 passing through p-channel transistor P1. Thus the differential input to the gates of transistors P1 and P2 must be substantially zero, even if the voltage at node B has relatively large excursions, as will occur when driving large amplifier output loads.

Figure 4:
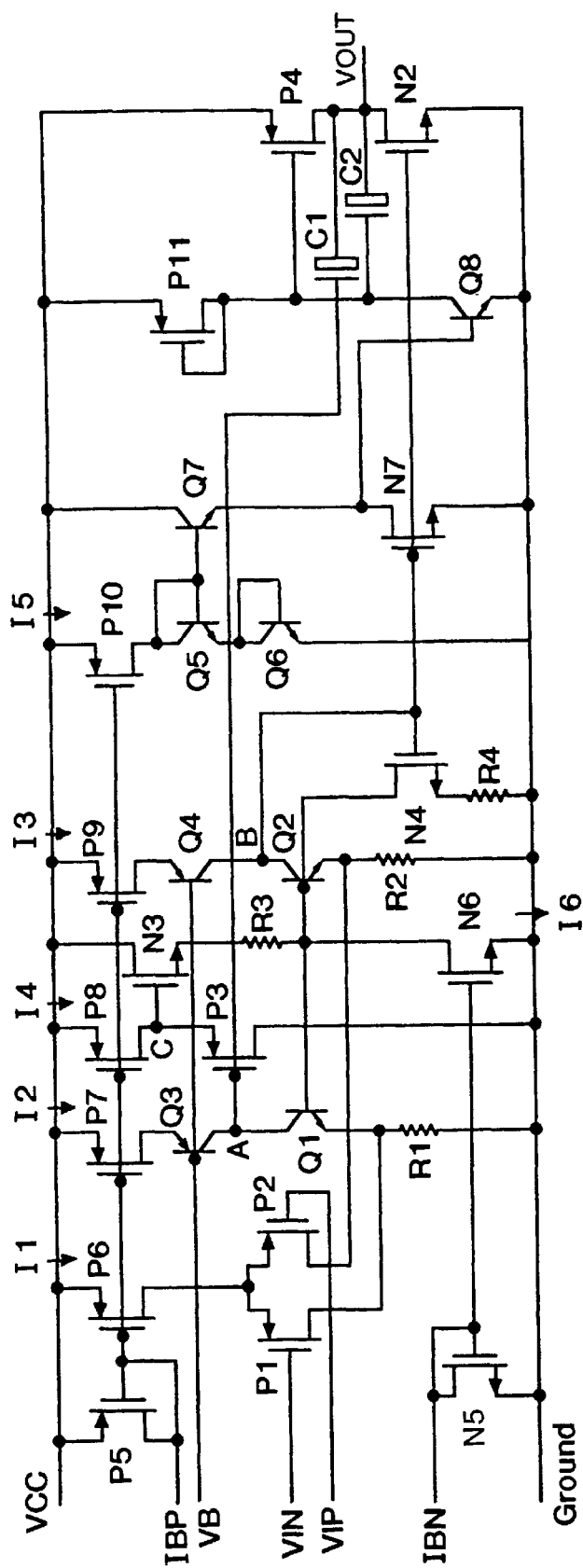
FIG. 4 is a more complete circuit diagram for a preferred embodiment of the present invention, the diagram showing additional details such as the details of the various current sources and the PMOS drive circuit.

Now referring to FIG. 4, a more complete circuit diagram of a preferred embodiment showing additional details such as the various current sources and the PMOS drive circuit may be seen. In this Figure, npn bipolar transistors Q1 and Q2, p-channel transistors P1 through P4, n-channel transistors N2 through N4 and resistors R1 through R4 function as herein before described with respect to FIG. 3. In FIG. 4, p-channel transistors P6 through P10 mirror the current IBP through p-channel transistor P5 to provide current sources I1, I2, I4, I3 and new current source I5, respectively. To avoid relative variations in current sources I2 and I3 from relative variations in the drain voltages of p-channel transistors P7 and P9, respectively, pnp bipolar transistors Q3 and Q4 are provided having a common base connection biased by a bias voltage VB. This clamps the drain voltages of p-channel transistors P7 and P9 at one VBE higher than the bias voltage VB, isolating the drains of p-channel transistors P7 and P9 from variations in the relative voltages at nodes A and B. In addition, in comparison to the circuit of FIG. 3, a further current source I6 sinking current from the common base connection of npn bipolar transistors Q1 and Q2 is provided by n-channel transistor N6 mirroring the current IBN through transistor N5. This provides additional pull-down for the common base connection of npn bipolar transistors Q1 and Q2.

The PMOS drive circuit is made up of bipolar transistors Q5 through Q8, p-channel transistor P11 and n-channel transistor N7. The PMOS drive circuit sets the quiescent operating current in the output transistors N2 and P4 and also drives the p-channel transistor P4 when sourcing current to an external load. Consider the case of a preferred embodiment wherein transistors Q5, Q6, Q7 and Q8 are all identical. The arrangement of these transistors is commonly referred to as a translinear circuit. Summing voltages around loop formed by Q5, Q6, Q7 and Q8:

$$VBE(Q6)+VBE(Q5)-VBE(Q7)-VBE(Q8)=0$$

Since $VBE=V_T^* \ln(I_C/I_S)$
where
$V_T$=thermal voltage
$I_C$=collector current and
$I_S$=transistor saturation current $$V_T\ln(I_{C5}/I_S)+V_T\ln(I_{C6}/I_S)=V_T\ln(I_{C7}/I_S)+V_T\ln(I_{C8}/I_S)$$

therefore $(I_{C5}^*I_{C6})/(I_{C7}^*I_{C8})=1$
or $I_{C8}=(I_{C5}^*I_{C6})/I_{C7}$ In the preferred embodiment, the channel width of n-channel transistor N7 is K times smaller than the dimensions of output n-channel transistor N2 and the channel width of p-channel P11 is J times smaller than that of output p-channel transistor P4. The current in transistors Q5 and Q6 is the current I5 and the current in Q7 is approximately the same as the current in n-channel N7, which in turn is 1/K times the current in the output transistor N2. The current in Q8 is approximately the same as that in p-channel transistor P11, which in turn is 1/J times the current in the output p-channel transistor P4. Under no load conditions and ignoring base currents and output impedance effects, $$I_{C8} = I5 * I5/I_{C7}$$
$$(IOUT/J) = I5 * I5/(IOUT/K)$$
$$IOUT = I5 * \sqrt{(J*K)}$$

Thus, under no-load conditions, both transistors will be conducting a substantially equal current controlled by the bias current I5 and the chosen ratios J and K.

To source current to an external load, the voltage at node B decreases, n-channel transistor N2 will be turned off somewhat, as will n-channel transistor N7. This will decrease the current in transistor Q7, which in turn will increase the current in transistor Q8, as predicted by the equations above. The increased current in Q8 flows through the diode-connected p-channel transistor P11, which is mirrored by the output transistor P4 to source to an external load. Likewise, to sink current from an external load, the voltage at node B increases, n-channel transistor N7 will be turned on somewhat harder, as will output n-channel transistor N2 and enable the amplifier to sink an external load current. The increase in the current in n-channel transistor N7 reduces the current in transistor Q8 and thus in p-channel transistors P11 and P4.

In the circuit of FIG. 4, capacitor C1 provides Miller capacitance and capacitor C2 provides local loop compensation for the PMOS drive circuit.

Figure 5:
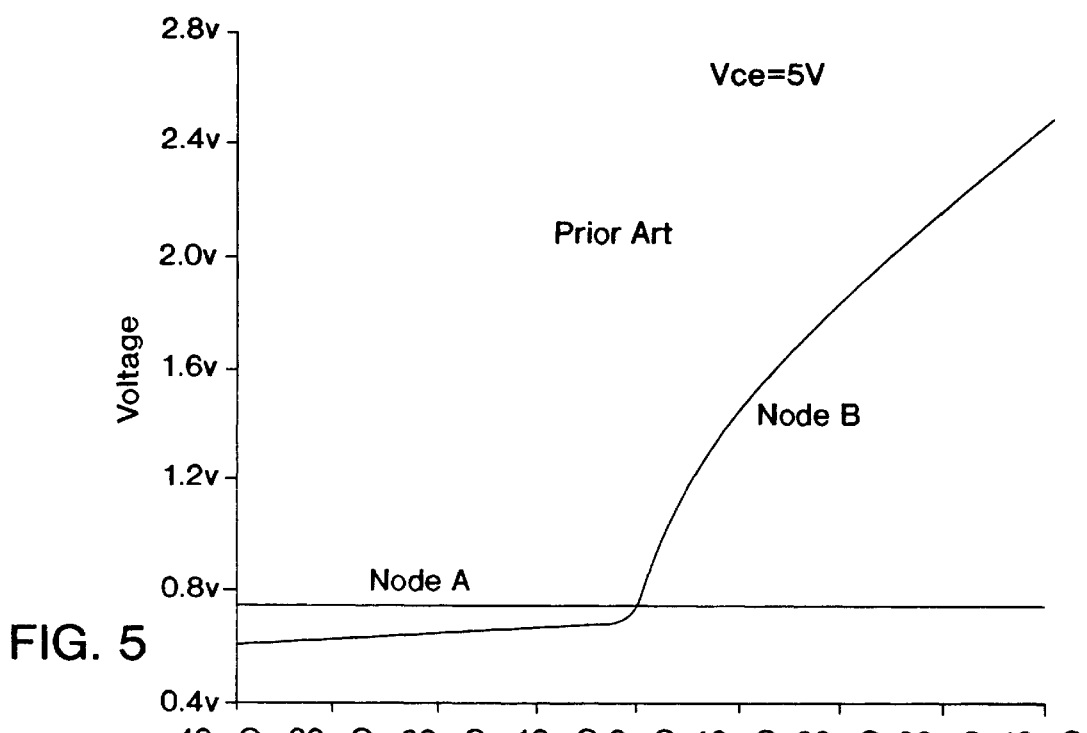
FIG. 5 is a curve showing the results of a simulation of a representative circuit of the prior art.
Figure 6:
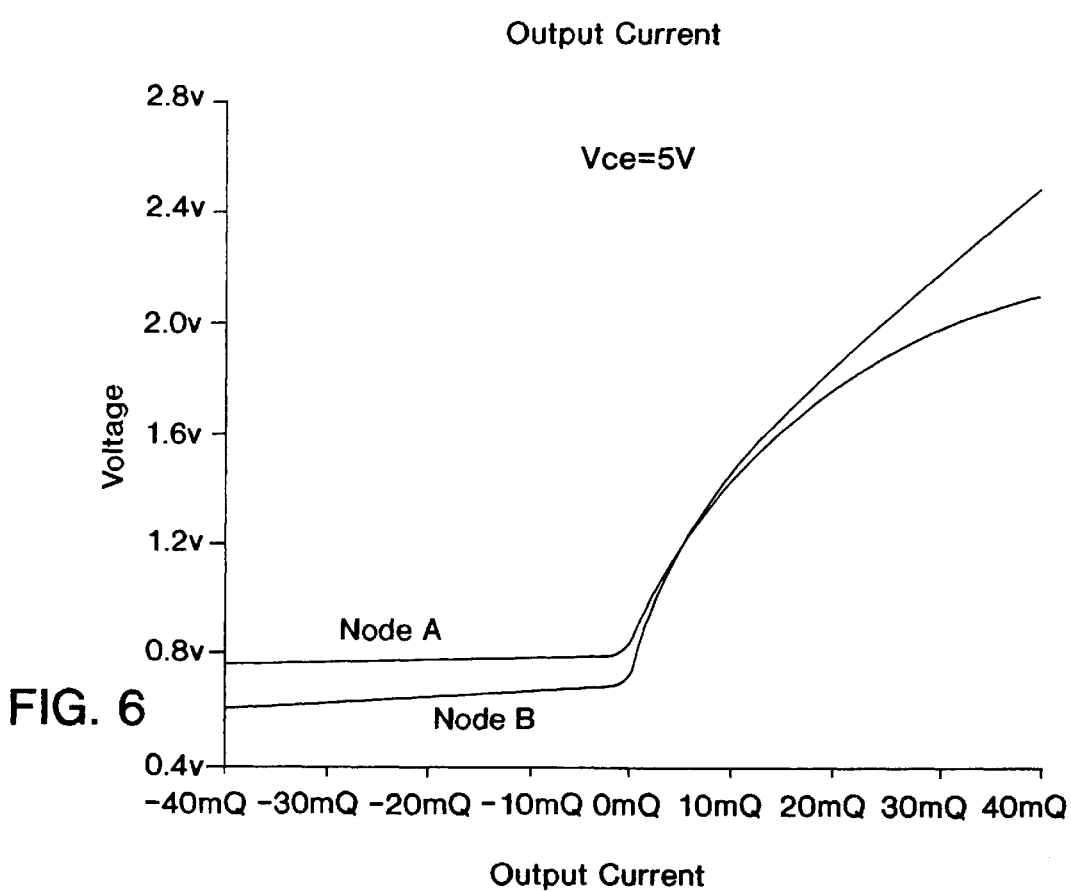
FIG. 6 is a curve showing the results of a simulation of a representative circuit of the present invention.

Now referring to FIGS. 5 and 6, the results of simulations of a representative prior art amplifier circuit and of a representative circuit in accordance with the present invention may be seen. In FIG. 5, it will be noted that the voltage at node A is substantially constant, whereas the voltage at node B has substantial excursions, particularly in the positive direction, representative of the output device drive required when sinking substantial current from a load on the amplifier. In FIG. 6, however, the voltage on node A approximately tracks the voltage on node B, effectively eliminating most of the reduced gain of the prior art caused by the Early effect by keeping more similar collector to emitter voltages on the two transistors of the folded cascode stage of the amplifier.

In the amplifiers representatively shown in FIGS. 2 and 3, and in more detail in FIG. 4, the differential input stage is shown as being comprised of p-channel MOS transistors, with the folded cascode stage being comprised of two npn transistors. It should be noted, however, that this combination, while representing a preferred embodiment of the invention, is somewhat arbitrary, as transistors of different conductivity types and different types of transistors may equally be used as desired. By way of example, the input stage could be comprised of two n-channel MOS transistors with bipolar transistors Q1 and Q2 being pnp transistors, or as a further alternative, the first and second stages may be transistors of the same kind, such as bipolar or MOS transistors, though of opposite conductivity types. As a further alternate, the output transistors P4 and N2 might also be transistors of other types, such as bipolar transistors, though the present invention is particularly advantageous with MOS transistor output drivers because the rather large voltage swing required to turn on the transistors, particularly the transistor sinking current from a large load. In that regard, MOS transistors also exhibit a form of the Early effect, namely that while conduction between source and drain is primarily controlled by the gate to source voltage, the conduction between source and drain is also influenced somewhat by the voltage between the source and drain. In particular, for a constant gate to source voltage, the current flowing between the source and drain increases with increased source to drain voltage. Thus, the present invention is useful with operational amplifiers of the general type described, with bipolar or other types of transistors as the second stage of the amplifier whenever such transistors exhibit the Early effect or its equivalent, whether the control is a base region controlling current flow between emitter and collector regions or some other control controlling current flow between two other regions such as a gate controlling current flow between source and drain of a MOS transistor.

Figure 7:
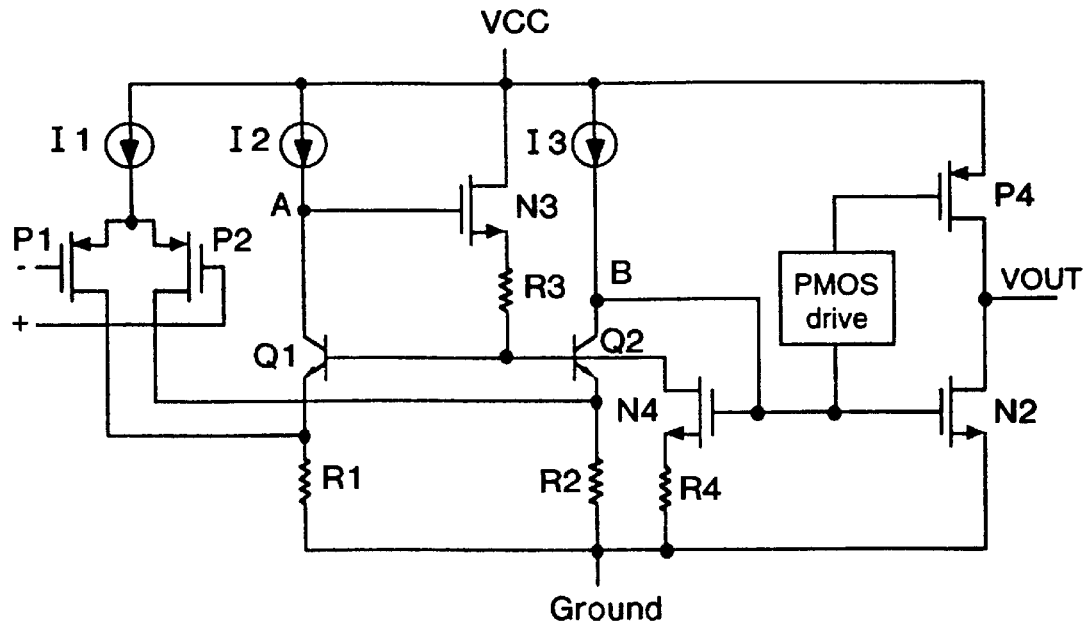
FIG. 7 is a circuit diagram for an alternate embodiment of the present invention.

Now referring to FIG. 7, an alternate embodiment of the invention may be seen. This embodiment is similar to the embodiment of FIG. 3, though p-channel transistor P3 and current source I4 have been eliminated and the gate of n-channel transistor N3 is connected directly to the collector of bipolar transistor Q1. In the embodiment of FIG. 3, the threshold of p-channel transistor P3 is in essence subtracted from the gate voltage of n-channel transistor N3 so that node A will approximately equal and follow the voltage at node B. In the embodiment of FIG. 7, however, no such threshold subtraction is provided so that in the embodiment of FIG. 7, node A will approximately follow or track node B, though with a substantial offset with respect to node B. This offset, however, is of little consequence, as the difference in operating conditions for transistors Q1 and Q2 caused by the offset remains approximately constant because of the approximate tracking of node B by node A, even in the presence of the offset.

Figure 8:
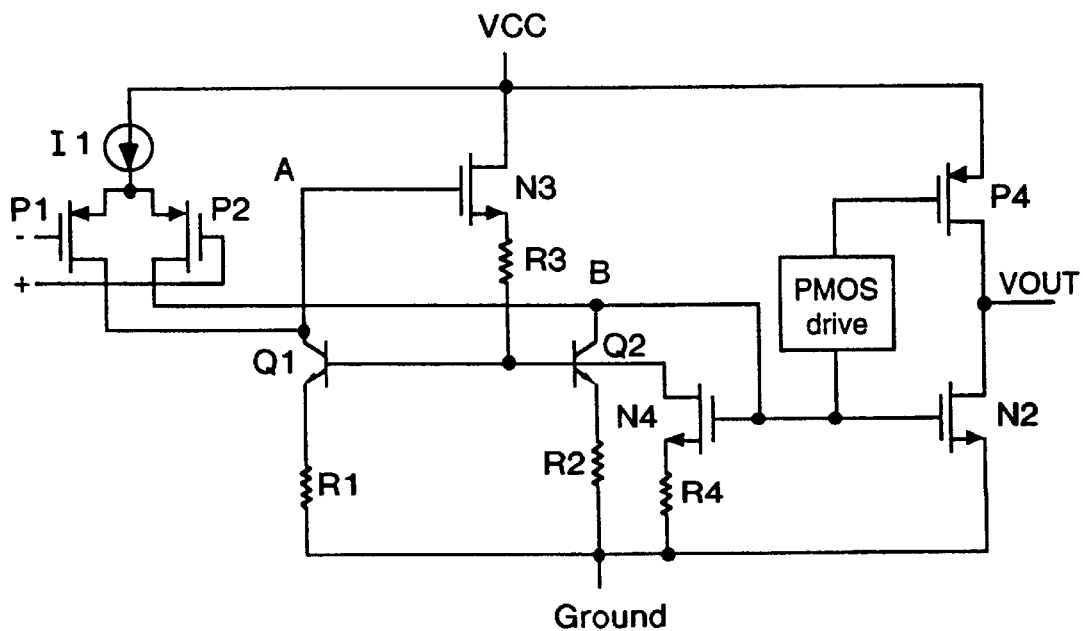
FIG. 8 is a circuit diagram for a still further embodiment of the invention.

FIG. 8 illustrates a still further embodiment of the invention. In this embodiment the output of the differential input stage from p-channel transistors P1 and P2 provide current directly to the collectors of transistors Q1 and Q2, respectively. This eliminates the need for current sources I2 and I3 of the embodiment of FIG. 7, with the circuit of FIG. 8 otherwise operating in the same manner as that of FIG. 7.

In the embodiments herein described with respect to FIGS. 3, 7 and 8, resistors R3 and R4 are optional, though preferred to limit the current drawn by n-channel transistors N3 and N4 when node B is driven high to sink large currents from an output load through n-channel transistor N2. If the resistors R3 and R4 are removed from the circuit, long channel devices for n-channel transistors N3 and N4 are preferably used to limit how low the resistance of the devices goes with higher voltages at node B.

Figure 9:
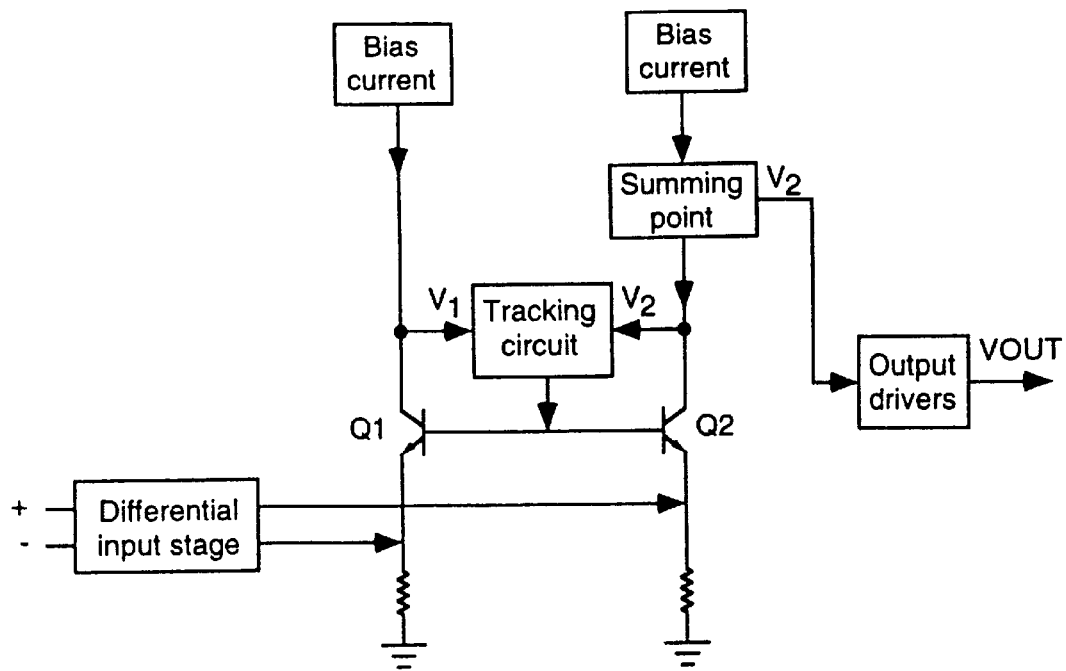
FIGS. 9, 10 and 11 are simplified diagrams illustrating two forms of the present invention and one form of prior art, respectively.
Figure 10:
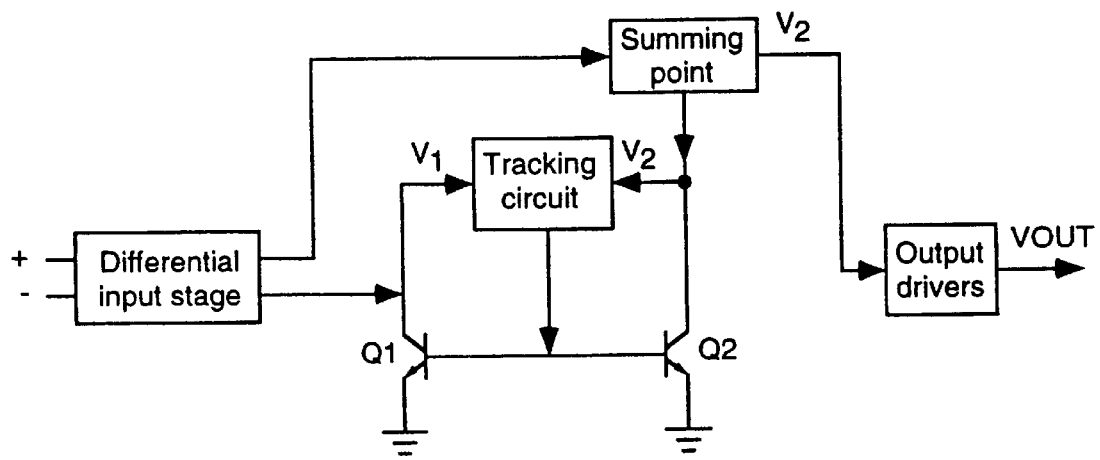
Figure 11:
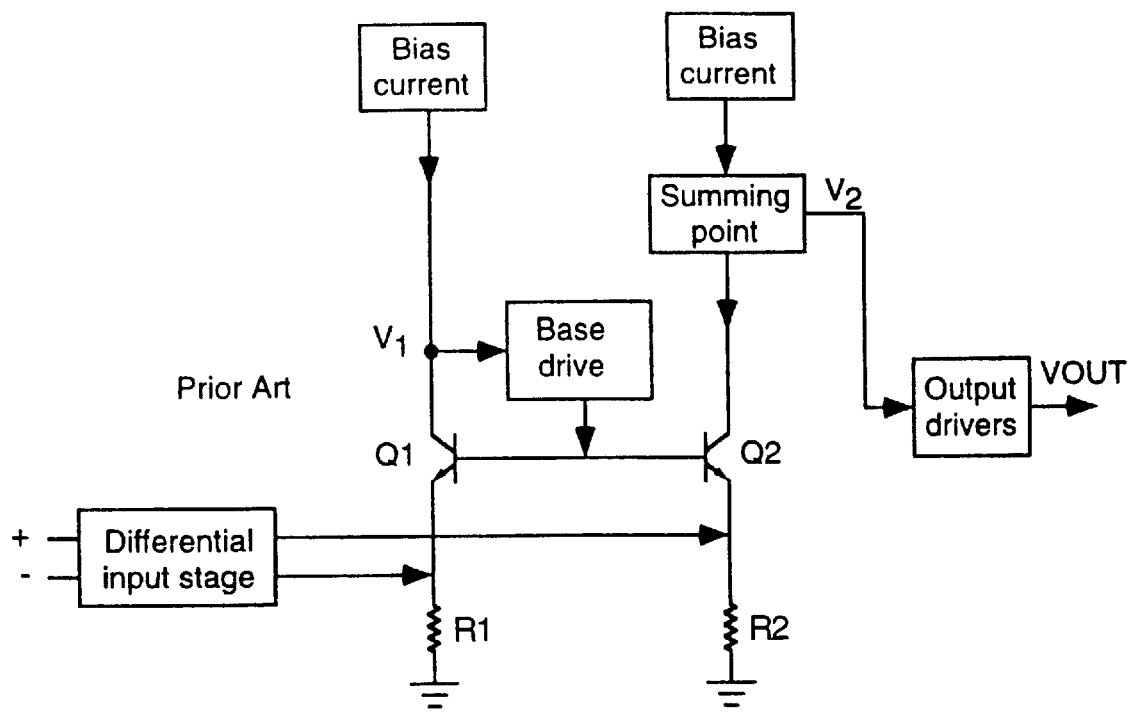

Now referring to FIGS. 9, 10 and 11, simplified diagrams illustrating two forms of the present invention and one form of prior art, respectively, may be seen. In the prior art of FIG. 11, two transistors Q1 and Q2 are each biased by bias currents, typically equal currents, mirrored from a common current source. A differential input current from the differential input stage is applied to resistors R1 and R2. A base drive circuit referenced to the voltage of the collector of transistor Q1 controls the base voltage of transistor Q1 so that the transistor conducts a current equal to the bias current.

In general, the current in resistor R2 will equal the current in resistor R1, including the components of current in the resistors due to the current from the differential input stage. Accordingly, the current through transistor Q2 will equal the current through transistor Q1, plus or minus the full differential current from the input stage. Thus, the net current into the summing point will equal plus or minus the full differential current from the input stage, charging or discharging the summing point as required to drive the output drivers to drive the differential input toward zero in a closed loop system. Since the base drive is referenced only to the collector of transistor Q1, the collector of transistor Q1 remains substantially fixed in voltage, while the collector of transistor Q2 varies as required to provide the appropriate drive to the output drivers. It is this lack of tracking of voltages of the two sides of the current mirror and the effects thereof to which the present invention is directed.

In the diagram of FIG. 9, the tracking circuit is referenced to the voltages on the collectors of both transistors Q1 and Q2. Thus, the tracking circuit has the ability to control the common base connection of transistors Q1 and Q2 to not keep the collector voltage V1 of transistor Q1 constant, but rather to have the collector voltage V1 of transistor Q1 approximately follow or track the voltage V2 on the collector of transistor Q2. As pointed out before, even approximate tracking substantially enhances the overall gain of the amplifier without any other changes therein. This tracking may be by making the voltages V1 and V2 approximately equal, or by having an offset there between, but having the voltages V1 and V2 vary in the same direction throughout the operating range.

In the embodiment of FIG. 10, the differential currents from the differential input stage are applied directly to the collectors of transistors Q1 and Q2, providing both the bias currents for the transistor mirror, and of course the differential input thereto. Again, however, the tracking circuit adjusts the voltage V1 of the collector of transistor Q1 in response to changes in the voltage V2 of the collector of transistor Q2, so that the two voltages vary together, with or without an offset. As with the embodiment of FIG. 9, the collector of transistor Q2 acts as a current summing point, with the voltage of the collector driving the output drivers.

There has been described herein methods and apparatus for increasing the gain of a differential amplifier, such as a typical operational amplifier, by substantial cancellation of the Early effect through the equalization of voltages between the input and the output of a current mirror typically used for the conversion of the differential input to a single-ended output. By this technique, an increase of the gain on the amplifier of 20 dB or higher may be achieved without any change to the amplifying transistors in the signal path. While bipolar transistors have been shown for transistors Q1 and Q2, corresponding advantages may be gained in amplifiers using other transistor types for transistors Q1 and Q2, such as MOS transistors. Thus, while the present invention has been shown and described with respect to certain preferred embodiments thereof, it will be understood by those skilled in the art that various changes in form and detail may be made therein without departing from the spirit and scope of the invention.

What is claimed is:

1. An amplifier comprising:

a differential input stage having a differential input and a differential output;

a second stage having first and second transistors, each having first and second regions and a control, the voltage between the first region and the control controlling the conduction between the first and second regions of each transistor, the first regions of the first and second transistors being coupled to a common voltage and the control of the first and second transistors being coupled together to form a current mirror to mirror current from the first transistor to the second transistor;

a pair of output drivers;

the differential output of the differential input stage being coupled to the first and second transistors;

the second region of the second transistor being coupled to the output drivers; and, a tracking circuit coupled to the second regions and the control of the first and second transistors, the tracking circuit controlling the control of the first and second transistors responsive to the voltage of the second region of the second transistor to cause the voltage of the second region of the first transistor to approximately track the voltage of the second region of the second transistor.

2. The amplifier of claim 1 wherein the differential output of the differential input stage is coupled to the first regions of the first and second transistors and the first regions of the first and second transistors are coupled to a common voltage through first and second resistors, respectively, the second regions of the first and second transistors being coupled to first and second bias current sources respectively.

3. The amplifier of claim 1 wherein the differential output of the differential input stage is coupled to the first regions of the first and second transistors.

4. The amplifier of claim 1 wherein the tracking circuit causes the voltage of the second region of the first transistor to approximately track the voltage of the second region of the second transistor with an offset voltage between the second regions of the first and second transistors.

5. In a differential amplifier, a stage for converting a differential input to the stage to a single ended output comprising:

first and second transistors, each having first and second regions and a control, the voltage between the first region and the control controlling the conduction between the first and second regions of each transistor, the first regions of the first and second transistors being coupled to a common voltage and the control of the first and second transistors being coupled together to form a current mirror to mirror current from the first transistor to the second transistor;

the differential input being coupled to the first and second transistors;

the second region of the second transistor being coupled to form the single ended output; and, a tracking circuit coupled to the second regions and the control of the first and second transistors, the tracking circuit controlling the control of the first and second transistors responsive to the voltage of the second region of the second transistor to cause the voltage of the second region of the first transistor to approximately track the voltage of the second region of the second transistor.

6. The amplifier of claim 5 wherein the differential input is coupled to the first regions of the first and second transistors and the first regions of the first and second transistors are coupled to a common voltage through first and second resistors, respectively, the second regions of the first and second transistors being coupled to first and second bias current sources respectively.

7. The amplifier of claim 5 wherein the differential input is coupled to the first regions of the first and second transistors.

8. The amplifier of claim 5 wherein the tracking circuit causes the voltage of the second region of the first transistor to approximately track the voltage of the second region of the second transistor with an offset voltage between the second regions of the first and second transistors.

\* \* \* \* \*